United States Patent
Suzuki et al.

(10) Patent No.: US 7,913,987 B2
(45) Date of Patent: Mar. 29, 2011

(54) SUBSTRATE MOUNTING TABLE FOR PLASMA PROCESSING APPARATUS, PLASMA PROCESSING APPARATUS AND INSULATING FILM FORMING METHOD

(75) Inventors: Takashi Suzuki, Miyagi (JP); Kaname Yasuda, Chiba (JP); Ryo Yamasaki, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 26 days.

(21) Appl. No.: 12/366,215

(22) Filed: Feb. 5, 2009

(65) Prior Publication Data

US 2009/0203223 A1    Aug. 13, 2009

(30) Foreign Application Priority Data

Feb. 8, 2008 (JP) .................. 2008-029189

(51) Int. Cl.
*B23Q 3/00* (2006.01)
(52) U.S. Cl. .................. 269/289 R; 269/302.1; 451/41
(58) Field of Classification Search .............. 269/289 R, 269/302.1, 71, 74; 451/41, 28
See application file for complete search history.

(56) References Cited

U.S. PATENT DOCUMENTS

| | | | | |
|---|---|---|---|---|
| 4,645,218 A | * | 2/1987 | Ooshio et al. ................. 279/128 |
| 5,670,066 A | * | 9/1997 | Barnes et al. ............ 219/121.58 |
| 5,676,360 A | * | 10/1997 | Boucher et al. ................. 269/74 |
| 5,996,218 A | * | 12/1999 | Shamouilian et al. .......... 29/825 |
| 2006/0102288 A1 | | 5/2006 | Satoh et al. |
| 2008/0142160 A1 | * | 6/2008 | Ueda et al. ............... 156/345.51 |

FOREIGN PATENT DOCUMENTS

| | | |
|---|---|---|
| JP | 2002299425 A | 10/2002 |
| JP | 2004-047653 A | 2/2004 |
| KR | 10-2006-0132466 A | 12/2006 |

OTHER PUBLICATIONS

Office action for Appl. No. JP 2008-029189 dated Nov. 17, 2009.
Chinese Office action for 2009100051873 dated Feb. 5, 2010.
Korean Office action for 10-2009-0009655 dated Nov. 15, 2010.

* cited by examiner

*Primary Examiner* — Lee D Wilson
(74) *Attorney, Agent, or Firm* — Pearne & Gordon LLP

(57) ABSTRACT

A substrate mounting table includes an electrostatic chuck for attracting and holding a target substrate and a base for holding the electrostatic chuck thereon. The base includes a protruding portion having a large height; and an outer peripheral surface provided around the protruding portion at a position lower than the protruding portion by a preset height. A thermally sprayed film having a thickness equivalent to a height difference between the protruding portion and the outer peripheral surface is deposited on the outer peripheral surface such that the thermally sprayed film becomes continuous with the protruding portion. The electrostatic chuck is formed by installing an electrode between insulating members, and the electrostatic chuck is fixed to the base by using an adhesive to cover a boundary between a top surface of the protruding portion and a surface of the thermally sprayed film.

4 Claims, 2 Drawing Sheets

SUBSTRATE MOUNTING TABLE FOR PLASMA PROCESSING APPARATUS, PLASMA PROCESSING APPARATUS AND INSULATING FILM FORMING METHOD

FIELD OF THE INVENTION

The present disclosure relates to a substrate mounting table for use in a plasma processing apparatus, for mounting thereon a target substrate to be processed such as a semiconductor wafer in a plasma processing apparatus to perform, for example, an etching process, a film forming process by using plasma; and also relates to a plasma processing apparatus and an insulating film forming method.

BACKGROUND OF THE INVENTION

For example, in the field of manufacture of a semiconductor device, an etching process, a film forming process or the like is performed by allowing plasma to act on a target substrate to be processed, such as a semiconductor wafer, by means of a plasma processing apparatus when forming a fine circuit structure of the semiconductor device.

In such plasma processing apparatus, since the plasma process is performed while accommodating the target substrate in a plasma processing chamber within a vacuum chamber maintained under depressurized atmosphere, it is difficult to attract and hold the target substrate by a vacuum chuck. Thus, an electrostatic chuck is utilized as a device for attracting and holding the target substrate. The electrostatic chuck is configured by disposing an electrostatic chuck electrode made of tungsten or the like between insulating members such as ceramics. Further, the target substrate is attracted and held by the Coulomb force generated by applying a DC voltage to the electrostatic chuck electrode.

Further, in the plasma processing apparatus, a substrate mounting table for mounting thereon the target substrate also serves as a lower electrode, and a base of the substrate mounting table needs to be made of a conductive metal such as aluminum. In this regard, as disclosed in, for example, Japanese Patent Laid-open Publication No. 2004-47653 (Patent Document 1), there is known a substrate mounting table configured by attaching an insulating member of an electrostatic chuck to a base made of aluminum or the like by using an adhesive. In this structure, the electrostatic chuck is a separate component from the base, and the insulating member is made of ceramics or the like.

The substrate mounting table is configured by fastening the electrostatic chuck made of the ceramics or the like onto the base formed of the aluminum or the like. The surface of the base is coated with an insulating film so as to prevent the base from being exposed to a highly corrosive processing gas, and the electrostatic chuck is fixed on the insulating film. To prevent an end portion of the insulating film from being exposed to the processing gas, a cavity such as a groove is provided in Patent Document 1, and the end portion of the insulating film is brought into contact with the cavity, and a helium gas is supplied into the cavity.

Patent Document 1: Japanese Patent Laid-open Publication No. 2004-47653

BRIEF SUMMARY OF THE INVENTION

However, if the cavity such as the groove is installed at the base, the structure thereof would be complicated, and the thickness thereof would also become non-uniform, thus making it difficult to control temperature or high frequency to be uniform. Moreover, the top surface of the base needs to be made as flat as possible to install the electrostatic chuck on the base. However, if the top surface of the base is not flat due to the variability of its thickness, the variability of the thickness needs to be compensated by the thickness of the adhesive used for the attachment.

In view of the foregoing, the present disclosure provides a substrate mounting table for a plasma processing apparatus, capable of flattening the top surface of a base and fixing the base with an electrostatic chuck firmly, and the present disclosure also provides a plasma processing apparatus and an insulating film forming method.

In accordance with one aspect of the present disclosure, there is provided a substrate mounting table for a plasma processing apparatus, including: a base whose top surface includes a first surface, a second surface provided around the first surface at a position lower than the first surface by a preset height, and an insulating film formed on the second surface in a thickness equivalent to the preset height to be continuous with the first surface; and an electrostatic chuck fixed on the top surface of the base, for holding a target substrate to be processed thereon.

By forming the insulating film on the second surface, which is lower than the first surface, so as to be continuous with the first surface, the top surface of the base can be flattened, so that the electrostatic chuck can be firmly fixed.

Desirably, the substrate mounting table further includes an inclined surface formed at a boundary between the first surface and the second surface of the base. By forming the insulating film on the inclined surface, peeling-off of an end portion of the insulating film becomes difficult.

Desirably, the insulating film is a ceramics film.

In accordance with another aspect of the present disclosure, there is provided a plasma processing apparatus including any one of the substrate mounting tables described above.

In accordance with still another aspect of the present disclosure, there is provided an insulating film forming method for forming, on a second surface of a base provided at a position lower than a first surface of the base by a preset height, an insulating film which has a thickness equivalent to the preset height to be continuous with the first surface, the method including: thermally spraying the insulating film on the surfaces; and rendering the thickness of the insulating film to be equivalent to the preset height by removing the insulating film located above the first surface on the surfaces.

Desirably, the insulating film forming method further includes forming an inclined surface between the first surface and the second surface.

It is desirable that the second surface is disposed around the first surface, and the insulating film forming method further includes: performing a masking process on the first surface with a mask member, except for on a periphery portion of the first surface, wherein, in the operation of thermally spraying the insulating film, the insulating film is thermally sprayed, except for on the mask member.

Desirably, the insulating film forming method further includes: roughening the periphery portion of the first surface, the second surface and the inclined surface. By roughening them, adhesivity of the thermally sprayed film can be improved.

In accordance with the present disclosure, the second surface is formed at the position lower than the first surface of the base by a preset height, and the insulating film having a thickness equal to the preset height is formed on the second surface to be continuous with the first surface. Therefore, the top surface of the base can be flattened, and the electrostatic chuck for holding the target substrate can be firmly fixed on the top surface of the base. Furthermore, since the insulating film is formed on the top surface of the base, exposure of the top surface of the base to a highly corrosive processing gas can be avoided. In addition, by flattening the top surface of the base, it becomes easy to control the distribution of temperature and high frequency to be uniform.

BRIEF DESCRIPTION OF THE DRAWINGS

The disclosure may best be understood by reference to the following description taken in conjunction with the following figures.

DETAILED DESCRIPTION OF THE INVENTION

Figure 1:
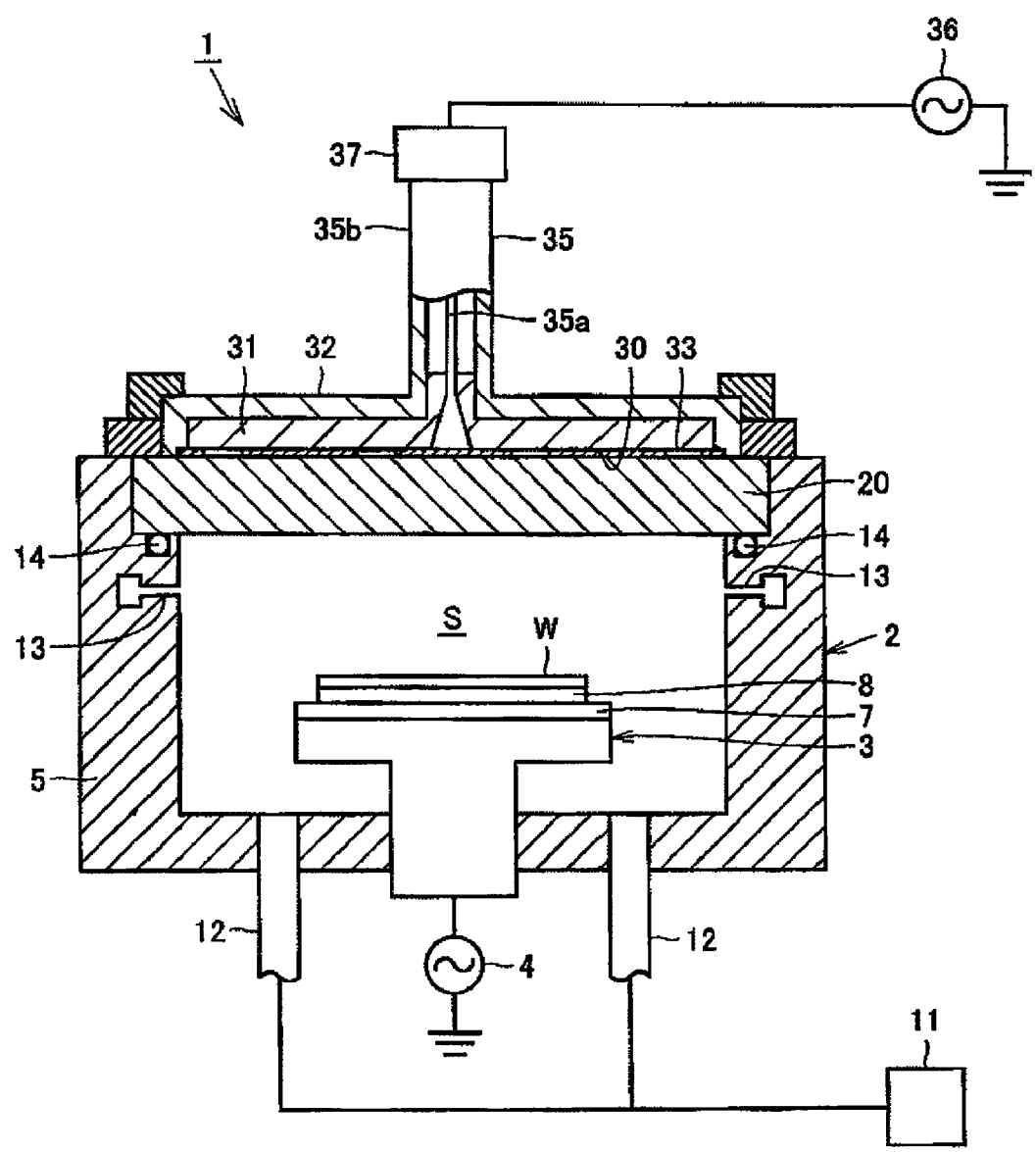
FIG. 1 is a longitudinal cross sectional view of a plasma processing apparatus in accordance with an embodiment of the present disclosure.

FIG. 1 is a longitudinal cross sectional view of a plasma processing apparatus in accordance with an embodiment of the present disclosure. In FIG. 1, a plasma processing apparatus 1 includes a cylindrical processing chamber 2 having a bottom and an open top. The processing chamber 2 accommodates therein a semiconductor wafer W, which is an example of a target substrate, such that the semiconductor wafer W can be transferred thereto. Further, the processing chamber 2 is grounded. Installed in a bottom portion of the processing chamber 2 is a susceptor 3 serving as a substrate mounting table for mounting the semiconductor wafer W thereon. The susceptor 3 includes a base 7 and an electrostatic chuck 8. The electrostatic chuck 8 attracts and holds the semiconductor wafer W by electrostatic force. A bias high frequency power is supplied to the susceptor 3 from an AD power supply 4 installed outside the processing chamber 2.

Installed at a bottom portion of the processing chamber 2 are gas exhaust pipes 12 for exhausting air inside of the processing chamber 2 by a gas exhaust unit 11 such as a vacuum pump or the like. Further, a gas introducing unit 13 for supplying a processing gas from a non-illustrated processing gas supply source is installed at a sidewall 5 of the processing chamber 2.

A circular top plate 20 made of, e.g., a dielectric such as quartz is fastened to the top opening of the processing chamber 2 via a seal member 14 which provides air-tightness. The top plate 20 is supported to face the susceptor 3, and other kinds of dielectric can be used instead of quartz. By the top plate 20, a processing space S is formed inside the processing chamber 2. The top plate 20 has a circular plane shape.

By a microwave supplied to the top plate 20, plasma is generated at the bottom surface thereof. Installed on the top plate 20 is a slot antenna 30 of a circular plate shape, and installed on the top surface of the slot antenna 30 are a wavelength shortening plate 31 and an antenna cover 32 covering the wavelength shortening plate 31. The slot antenna 30 is made of a thin circular copper plate coated with a conductive material, e.g., Ag, Au, or the like, and has a number of slots 33 arranged in a spiral or concentric pattern.

A coaxial waveguide 35 is connected with the antenna cover 32, and the coaxial waveguide 35 includes an internal conductor 35a and an external tube 35b. The internal conductor 35a is connected with the slot antenna 30. The internal conductor 35a's portion on the side of the slot antenna 30 has a cone shape so that the microwave is efficiently propagated to the slot antenna 30. The coaxial waveguide 35 propagates the microwave of, e.g., about 2.45 GHz generated from a microwave supply device 36 to the top plate 20 via a load matching box 37, the coaxial waveguide 35, the wavelength shortening plate 31, and the slot antenna 30. By the energy of the microwave, an electric field is generated at the bottom surface of the top plate 20, whereby the processing gas supplied into the processing chamber 2 from the gas introducing unit 13 is excited into plasma, so that a preset plasma process such as a film forming process, an etching process, or the like is performed on the semiconductor wafer W on the susceptor 3.

During the plasma process, the plasma processing apparatus 1 having the above-described configuration attracts and holds the semiconductor wafer W by the electrostatic chuck 8 on the susceptor 3 inside the processing chamber 2, and the gas is exhausted through the gas exhaust pipes 12 while supplying the preset processing gas into the processing chamber 2 from the gas introducing unit 13, thereby maintaining the inside of the processing space S at a preset pressure level. Then, the bias high frequency is applied to the semiconductor wafer W by the AC power supply 4, and the microwave is generated by the microwave supply device 36. Further, by introducing the microwave into the processing chamber 2 via the top plate 20, the electric field is generated under the top plate 20. As a result, the processing gas in the processing space S is excited into plasma. By selecting different processing gases, various plasma processes such as an etching process, an ashing process, a film forming process, and the like can be performed on the semiconductor wafer W.

FIGS. 2A to 2E set forth cross sectional diagrams to explain a manufacturing method of the base 7 and the electrostatic chuck 8 incorporated in the susceptor 3 illustrated in FIG. 1.

The substrate mounting table for the plasma processing apparatus in accordance with the embodiment of the present disclosure includes the base 7 and the electrostatic chuck 8. The top surface of the base 7 is made up of: a circular protruding portion 72 serving as a first surface; an outer peripheral surface 71 serving as a second surface, provided to surround the protruding portion 72 at a position lower than the protruding portion 72 by a certain height; and a thermally sprayed film 76 serving as an insulating film formed on the outer peripheral surface 71 to be continuous with the protruding portion 72. The electrostatic chuck 8 for holding the semiconductor wafer W as a target substrate is fixed on the top surface of the base 7.

Figure 2A:
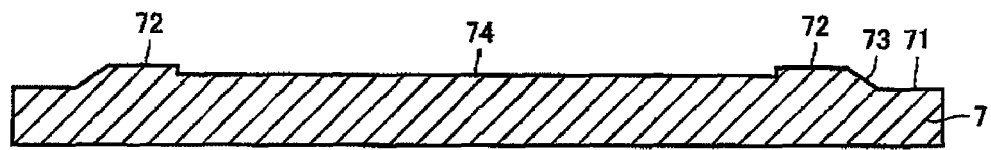
FIGS. 2A to 2E are cross sectional diagrams to describe a manufacturing method of a base 7 and an electrostatic chuck 8 incorporated in a susceptor 3 shown in FIG. 1.

To elaborate, as shown in FIG. 2A, the base 7 is made of an aluminum cooling plate and it has a circular plate shape. The base 7 is provided with the circular protruding portion 72 having a height relatively higher at a central portion thereof, and the outer peripheral surface 71 is provided around the protruding portion 72 to be positioned lower than the protruding portion 72. The protruding portion 72 is formed to be cut off when the top surface of the base 7 is flattened in a finishing process. A gentle inclined surface 73 is formed from the outer peripheral surface 71 of the base 7 up to the protruding portion 72 thereof, and a flat portion 74 depressed relative to its periphery is formed on the center of the protruding portion 72. Such shape of the base 7 can be obtained by cutting and severing a circular aluminum plate.

Figure 2B:
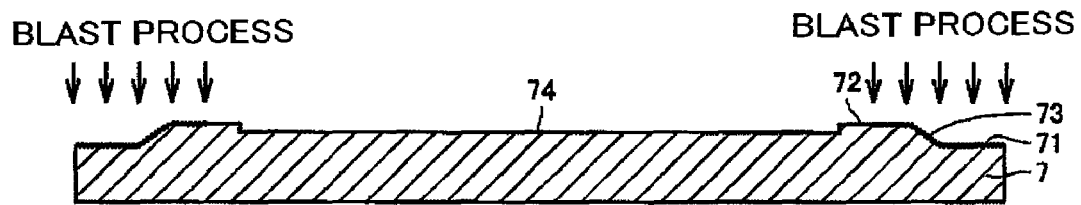
Figure 2C:
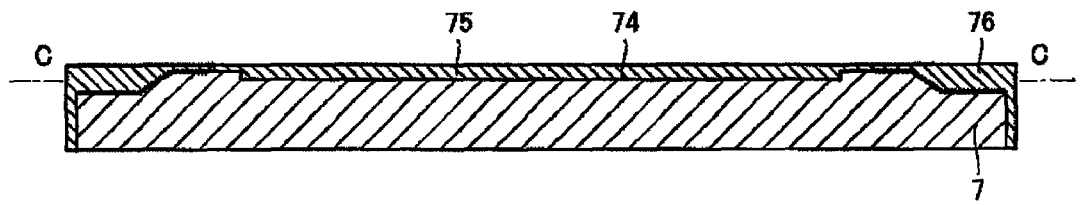

As illustrated in FIG. 2B, a blast process is performed on the outer peripheral surface 71 and the periphery portion on the protruding portion 72 of the base 7, whereby they are roughened. Then, as shown in FIG. 2C, a masking process is performed not on the roughened outer peripheral surface 71 and the periphery portion of the protruding portion 72 but on the flat portion 74 and the protruding portion 72 by using a mask member 75. Then, the thermally sprayed film 76 is formed on the roughened outer peripheral surface 71 and the periphery portion of the protruding portion 72. The thermally sprayed film 76 is formed in a thickness corresponding to a height difference between the protruding portion 72 and the outer peripheral surface 71. The thermally sprayed film 76 is, for example, a low-resistance ceramics film, and its thickness is chosen to be, e.g., about 350 μm.

Figure 2D:
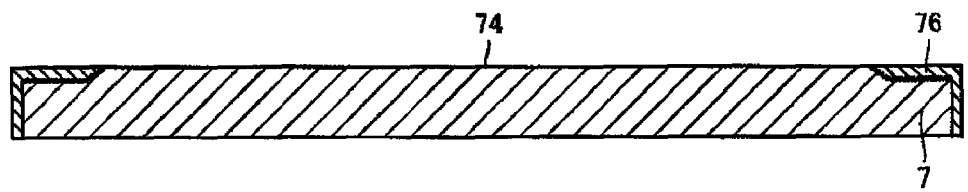

After removing the mask member 75 shown in FIG. 2C, the thermally sprayed film 76 and the protruding portion 72 are polished so that their portions above the line C-C are removed. Then, as illustrated in FIG. 2D, the finishing process is performed such that the top surface of the protruding portion 72 of the base 7 and the top surface of the thermally sprayed film 76 become continuous with the flat portion 74.

Figure 2E:
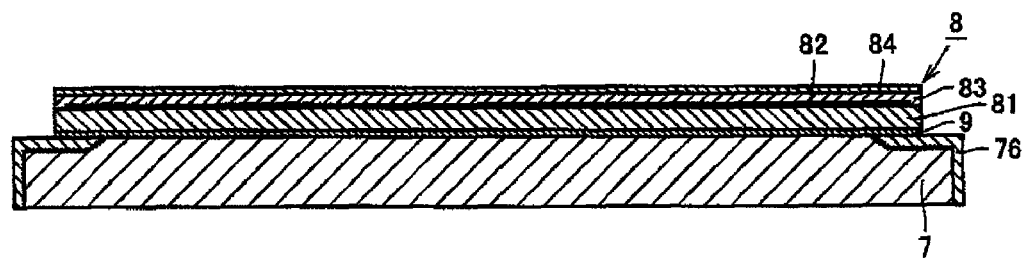

Thereafter, as shown in FIG. 2E, an adhesive 9 is coated on the flat portion 74, and the electrostatic chuck 8 is mounted thereon, whereby the electrostatic chuck 8 is fixed onto the base 7. As for the electrostatic chuck 8, one described in, for example, Japanese Patent Laid-open Publication No. 2006-60040 may be used. That is, the electrostatic chuck 8 is obtained by forming a metal film 82 serving as an electrode on an insulating substrate 81; forming a thermally sprayed film 83 of low-resistance ceramics covering the metal film 82; and then forming a thermally sprayed film 84 of high-resistance ceramics, whose top surface serves as an electrostatic attraction surface, on the thermally sprayed film 83.

Alternatively, the electrostatic chuck 8 may be obtained by interposing an electrode between two sheets of substrates and then integrating them as one body by a pressing process.

As explained above, in accordance with the embodiment of the present disclosure, by roughening the outer peripheral surface 71 and the inclined surface 73 which are on the top portion of the base 7 and then forming the thermally sprayed film 76 thereon, the flat base 7 can be obtained. Further, since the end portion of the thermally sprayed film 76 is prevented from being exposed, it becomes difficult for the thermally sprayed film 76 to be peeled off from the outer peripheral surface 71 or the inclined surface 73. Further, since the electrostatic chuck 8 is fixed by the adhesive 9 to cover the boundary portion between the thermally sprayed film 76 and the flat portion 74, the boundary portion between the thermally sprayed film 76 and the flat portion 74 is protected from coming into contact with a processing gas containing highly corrosive fluorine radicals or the like during the plasma process, so that the peeling-off of the thermally sprayed film 76 can be made more difficult.

Furthermore, though the inclined surface 73 is formed from the outer peripheral surface 71 up to the protruding portion 72, it is not limited to the inclined surface and it may be a vertical surface.

The above description of the present invention is provided for the purpose of illustration, and it would be understood by those skilled in the art that various changes and modifications may be made without changing technical conception and essential features of the present invention. Thus, it is clear that the above-described embodiment is illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

INDUSTRIAL APPLICABILITY

A substrate mounting table for a plasma processing apparatus in accordance with the present disclosure may be used to mount thereon a semiconductor wafer in a processing chamber of a plasma processing apparatus.

What is claimed is:

1. A substrate mounting table for a plasma processing apparatus, comprising:
   a base including a first surface, a second surface provided around the first surface at a height lower than the first surface by a preset height, and an insulating film formed on the second surface and having a thickness equal to the preset height; and
   an electrostatic chuck for holding a target substrate to be processed thereon,
   wherein the first surface of the base and a top surface of the insulating film form a continuous top surface of the base, and
   the electrostatic chuck is fixed on the continuous top surface of the base.

2. The substrate mounting table of claim 1, further comprising:
   an inclined surface formed at a boundary between the first surface and the second surface of the base.

3. The substrate mounting table of claim 1, wherein the insulating film is a ceramics film.

4. A plasma processing apparatus comprising a substrate mounting table as claimed in claim 1.

\* \* \* \* \*